United States Patent

Pierrat et al.

Patent Number: 5,976,732
Date of Patent: Nov. 2, 1999

[54] PHOTOMASK FOR RECONFIGURING A CIRCUIT BY EXPOSURE AT TWO DIFFERENT WAVELENGTHS

[75] Inventors: Christophe Pierrat; J. Brett Rolfson, both of Boise, Iowa

[73] Assignee: Micron Technology, Inc., Boise, Id.

[21] Appl. No.: 09/003,543

[22] Filed: Jan. 6, 1998

[51] Int. Cl.$^6$ ..................................................... G03F 9/00
[52] U.S. Cl. ............................................................. 430/5
[58] Field of Search ................................. 430/5, 322, 323, 430/324

[56] References Cited

U.S. PATENT DOCUMENTS 5,670,281  9/1997  Dai ............................................. 430/5

*Primary Examiner*—S. Rosasco
*Attorney, Agent, or Firm*—Arnold, White, & Durkee

[57] ABSTRACT

A photomask for printing multiple configurations includes a transparent substrate and a patterned opaque layer on a surface of the substrate defining transmitting and non-transmitting portions. A phase shifting layer is provided adjacent the opaque layer and has a depth such that it shifts a light having a first wavelength about 180° and shifts the phase of a second light about 0°.

18 Claims, 2 Drawing Sheets

PHOTOMASK FOR RECONFIGURING A CIRCUIT BY EXPOSURE AT TWO DIFFERENT WAVELENGTHS

This invention was made with government support under Contract No. MDA 972-92-C-0054 awarded by Advanced Research Projects Agency (ARPA). The government has certain rights in this invention.

BACKGROUND OF THE INVENTION

The present invention relates to photomasks or reticles used in the fabrication of semiconductor devices. More particularly, the present invention relates to phase shifting photomasks and processes for designing them.

Advances in capacity in semiconductor chips have generally been the result of decreases in the size of the features on the chip. The lateral dimensions of features are generally defined by photolithographic techniques in which a detailed pattern is transferred to a photoresist by shining light through a mask or reticle.

In recent years, phase shifting masks have been developed to improve photolithographic processes. Phase shifting masks increase image contrast and resolution without reducing wave length or increasing numerical aperture. These masks also improve depth of focus and process latitude for a given feature size.

With phase shift photolithography, the interference of light rays is used to overcome the problems of diffraction and improve the resolution and depth of optical images projected onto a target. With this technology, the phase of the exposure light at the target is controlled such that adjacent bright areas are preferably formed 180° out of phase with each other. Dark regions are thus produced between the bright areas by destructive interference even when diffraction would otherwise cause these areas to be lit. This technique improves total resolution at the target.

In general, a phase shifting mask is constructed with a repetitive pattern formed of three layers of material. An opaque layer provides areas that allow no light transmission. A first transparent layer provides areas which allow close to 100% of the light to pass through. A transparent phase shifting layer provides areas which allow close to 100% of the light to pass through but phase shifted 180 degrees from the light passing through the first transparent layer. The first transparent layer and the phase shifting layer are positioned such that light rays diffracted through each area are cancelled out in a darkened area between them. This creates a pattern of dark and bright areas which can be used to clearly delineate features of a pattern defined by the opaque layer on the semiconductor wafer. Another method of constructing a phase shifting mask utilizes a semitransparent layer to cause the phase shift.

One process for fabricating phase shifting masks includes forming an opaque layer on a major surface of a transparent substrate, patterning the opaque layer to expose portions of the underlying transparent substrate, forming a phase shifting mask layer to expose the portions of the underlying transparent substrate, phase-etching the exposed portions of the transparent substrate until a 180° phase shift is accomplished. Other processes of fabricating phase shifting masks include those in which a transparent film is formed over a portion of a mask to create a phase shift as well as the etching of rim shifting channels into the mask substrate.

With their increasing complexity, photomasks have become more difficult to design and fabricate over the years. Accordingly, its is desirable to fabricate photomasks which have the longest useful life possible. Additionally, it is advantageous to design photomasks which have the widest application possible.

Accordingly, it would be a significant advancement in the art to provide a photomask and method of fabrication wherein the photomask could be used to print features with different sizes or different configurations from the same mask. Such a photomask is disclosed and claimed herein.

BRIEF SUMMARY OF THE INVENTION

The present invention provides a photomask that can be used to print multiple configurations by varying the wavelength of the exposure light. The photomask includes a phase shifting layer which transmits light with about a 0° phase shift at a first wave length and which transmits light at about 180° phase shift at a second wave length.

The photomask of the present invention can be used to print patterns in which the line width is varied by adjusting the wavelength of the exposure light. Additionally, the invention can be used to print multiple configurations. For example, in one embodiment, two lines have their ends spaced apart when printed at a first wave length. When printed at a second wave length, the two lines are connected into a single line.

DETAILED DESCRIPTION OF THE PREFERRED EMBODIMENTS

The present invention provides a novel photomask which is capable of printing two different patterns depending upon the wave length of the exposure light that is used. The invention is best understood by reference to the attached drawings in which like parts are designated with like numerals.

Figure 1:
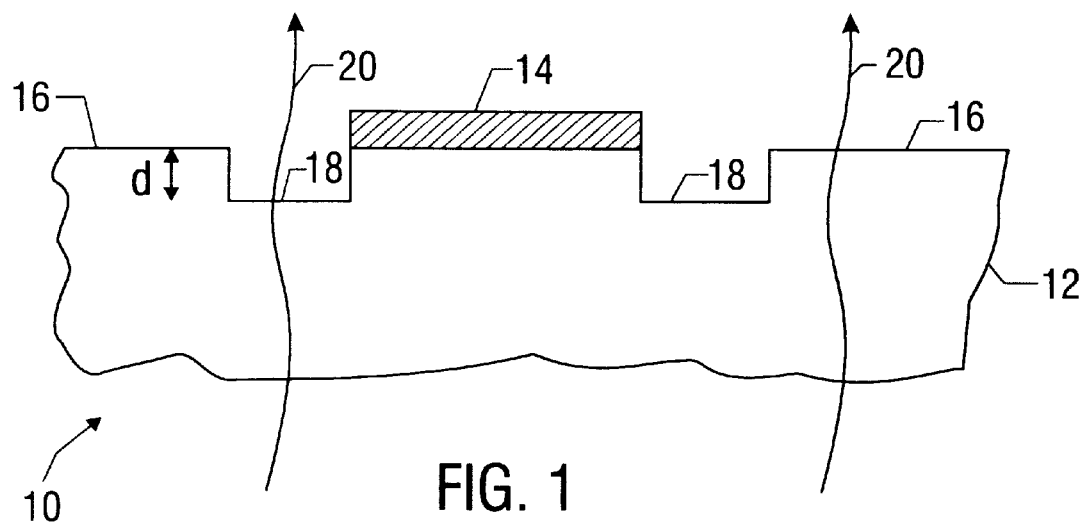
FIG. 1 is a schematic cross-sectional view of a portion of a phase shifting mask according to one embodiment of the present invention.

Reference is first made to FIG. 1 which schematically illustrates a portion of a photomask according to a first embodiment of the present invention. In this embodiment, different feature sizes can be printed by using different exposure wavelengths. A photomask, generally designated as 10, includes a transparent quartz substrate 12 on which a chrome layer 14 has been deposited and patterned using standard techniques. Substrate 12 includes an exposed surface 16 through which light 20 can be transmitted. A phase shifting layer 18 is etched into substrate 12 to a depth d adjacent chrome layer 14. Light 20 can also pass through phase shifting layer 18.

The etch depth d is selected such that:

$$\phi_2(\lambda_2) - \phi_1(\lambda_2) = 0(\pm 2\kappa\pi) \tag{1}$$

$$\phi_2(\lambda_1) - \phi_1(\lambda_1) = \pi(\pm 2\kappa'\pi) \tag{2}$$

wherein $\phi$ equals the phase of light and $\lambda$ equals the wavelength of the light.

In this case, the photomask illustrated in FIG. 1 will behave like a rim shifter mask when it is illuminated at a wavelength of $\lambda_1$, and like a regular chrome on quartz mask when illuminated at a wavelength of $\lambda_2$. As a result, the line width of the printed line on the wafer will be different. At $\lambda_1$, the line width will correspond to the width of the chrome layer 14 plus the width of the phase shifting layers 18 on each side.

An example of suitable values that can be used in the embodiment illustrated in FIG. 1 with quartz substrate 12 are:

$\lambda_1$=365 nm
$\lambda_2$=248 nm
d=1.942 $\mu$m
using these values:

$$\phi_2(\lambda_1)-\phi_1(\lambda_1)=188° \quad (3)$$

$$\phi_2(\lambda_2)-\phi_1(\lambda_2)=-7° \quad (4)$$

The value of 188° obtained in equation 3 is close enough to 180° to obtain the wider line width. Similarly, the value of −7° obtained in equation 4 is close enough to 0° to print just the line width of the chrome layer 14.

In order to design a phase shifting mask whereby a 180° phase shift is obtained at a first wave length and a 0° phase shift is obtained at a second wave length, it is necessary to find a common depth for the phase shifting layer 22 which will produce the desired phase shifts. This can be accomplished by using the formula $$d = \frac{i\lambda}{2(n-1)} \quad (5)$$

wherein d equals depth of the etch, i equals an odd number for a 180° phase shift and an even number for a 0° phase shift, $\lambda$ equals the wave length of exposure light and n equals the refractive index of the material the light travels through. Setting d to be approximately equal for two different wave lengths results in the following equation $$\frac{i_1\lambda_1}{2(n_1-1)} \approx \frac{i_2\lambda_2}{2(n_2-1)} \quad (6)$$

since $\lambda_1$, $\lambda_2$, $n_1$ and $n_2$ are known quantities, $i_2$ can be expressed as a function of $i_1$ $$i_2 \approx \frac{i_1\lambda_1}{(n_1-1)} \cdot \frac{(n_2-1)}{\lambda_2} \quad (7)$$

This equation can be solved for various wave lengths and substrate materials. For example, for an i-line process with a quartz substrate, $n_{365}$ equals 1.474 such that an etch depth of 3850 Å produces a shift of 180°. For a deep UV process at 248 nm, $n_{248}$ equals 1.508 such that a 2440 Å quartz etch shifts the light 180°. Substituting these values into equation 5, results in $$i_2 = i_1(1.5773) \quad (8)$$

A table can be created to help determine an appropriate value for $i_1$ and $i_2$. Using the values from equation 8 results in the following table:

| $i_1$ | $i_2$ |
|---|---|
| 1 | 1.5773 |
| 3 | 4.7319 |
| 5 | 7.8865 |
| 7 | 11.0411 |
| 9 | 14.1957 |
| 11 | 17.3503 |

From this table it is apparent that at $i_1$, equals 5, $i_2$ is approximately equal to an even integer, in this case 7.8865.

Using a value of 5 for $i_1$, it is possible to calculate a depth for the phase shifting layer which will produce a 180° phase shift for $\lambda_1$ and an approximately 0° phase shift for $\lambda_2$. Using a value of $i_2$ equals 8 it is possible to obtain a depth which will produce a 0° phase shift for $\lambda_2$ and an approximately 180° phase shift for $\lambda_1$. In order to obtain a mask which works equally well at both wave lengths, the difference in the depths should be averaged. For $i_1$ equals 5, d equals 19250Å. For $i_2$ equals 18, d equals 19520Å. Since a phase change at 365 nm requires 0.634 as much depth as an equal phase change at 248 nm the compromise depth can be calculated as follows:

$$19250+(0.634)(19520-19250)=19420 \text{ Å} \quad (9)$$

Thus, a quartz mask having a phase shifting layer about 19420 Å deep can be used with an i-line exposure at 365 nm and a deep UV exposure at 248 nm. It will be appreciated by those skilled in the art that similar calculations can be performed to design a mask fabricated from other substrate materials or a mask to be used with different exposure lights. Additional substrate materials that have been used for photomasks include borosilicate glass and soda-lime glass. Other exposure lights include g-line at 436 nm, h-line at 405 nm, and deep UV at 193 nm.

Figure 2:
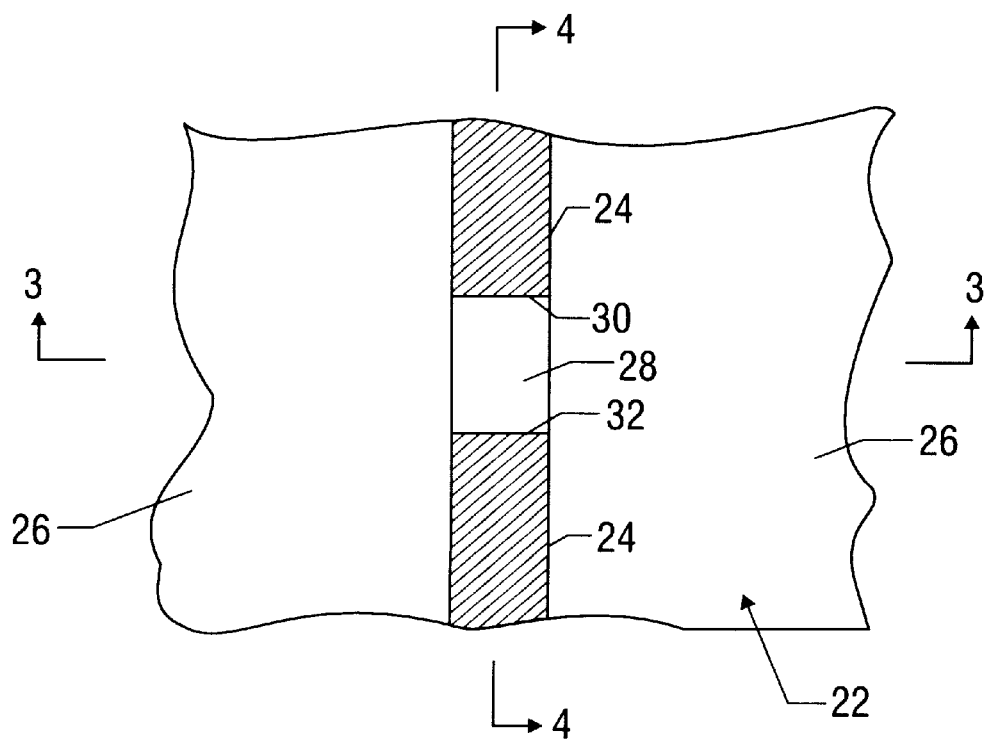
FIG. 2 is a top plan view of a portion of a phase shifting mask according to a second embodiment of the present invention.
Figure 3:
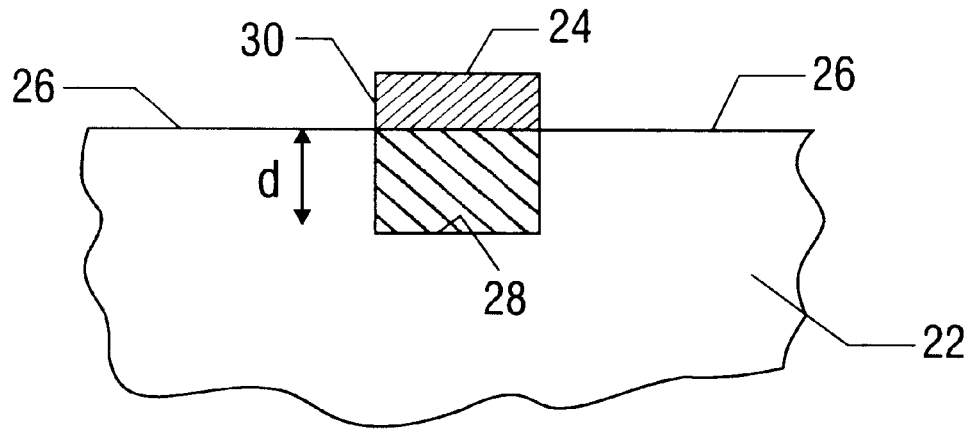
FIG. 3 is a schematic cross-sectional view taken along line 3—3 of FIG. 2.
Figure 4:
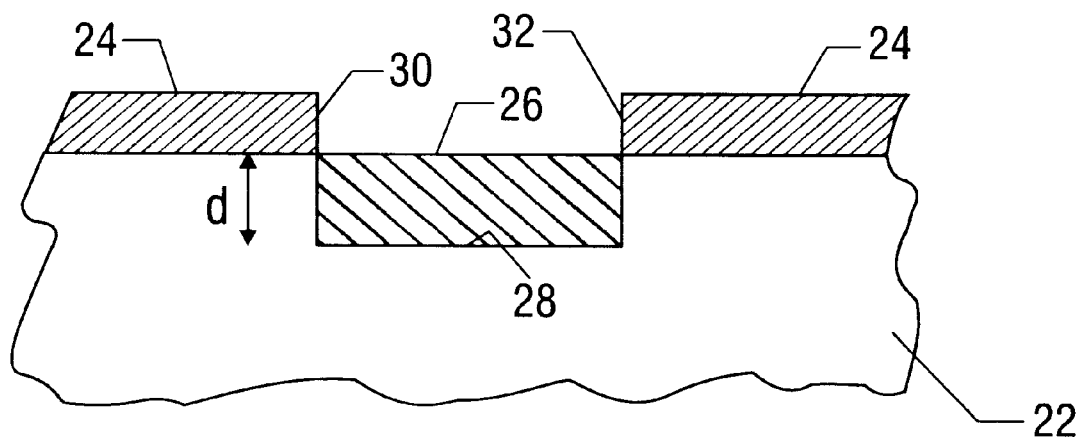
FIG. 4 is a schematic cross-sectional view taken along line 4—4 of FIG. 2.

Reference is next made to FIGS. 2–4 which illustrate a second preferred embodiment of the present invention. In this embodiment, a chrome layer 24 is patterned on substrate 22. As illustrated, chrome layer 24 comprises two segments of a line with their ends 30 and 32 spaced apart. An exposed surface 26 of substrate 22 is located on each side of chrome layer 24. A phase shifting layer 28 is etched into substrate 12 between the ends 30 and 32 of chrome layer 24.

The etch depth d of phase shifting layer 28 is selected such that at a first wave length, the phase is about 180° different than the phase of light passing through exposed surface 26. At a second wave length, the phase of light passing through phase shifting layer 28 is about 0 degrees different than light passing through exposed layer 26. As described above with respect to FIG. 1, with a wave length of $\lambda_1$=365 nm at a depth of d=1.942 $\mu$m, the phase of the light passing through phase shifting layer 28 is 188°. With a wave length of $\lambda_2$=248 nm, the phase of the light passing through layer 28 is −7°. Accordingly, when the photomask is exposed at wavelength of $\lambda_1$, phase shifting layer 28 will print as dark area making chrome layer 24 appear to be a continuous line. If a wavelength of $\lambda_2$ is used, the chrome layers will print as disconnected segments.

While the invention has been described with respect to the presently preferred embodiments, it will be appreciated by those skilled in the art that it may be embodied in other specific forms without departing from the spirit or essential characteristics of the invention. For example, while the illustrated embodiments utilize subtractive phase shifting layers, the invention can also be utilized with additive phase shifting layers. Accordingly, all modifications or changes which come within the meaning and range of equivalency of the claims are to be embraced within their scope.

What is claimed is:

1. A photomask for printing multiple configurations comprising:
   a transparent substrate;
   a patterned opaque layer on a surface of said substrate defining transmitting and non-transmitting portions; and
   a phase shifting layer having a depth that shifts the phase of a first exposure light about 180° and the phase of a second exposure light about 0°.

2. A photomask for printing multiple configurations as defined in claim 1 wherein the substrate comprises quartz.

3. A photomask for printing multiple configurations as defined in claim 2 wherein the depth of the phase shifting layer is about 1.942 μm and the first exposure light has a wave length of about 365 nm and the second exposure light has a wavelength of about 248 nm.

4. A photomask for printing multiple configurations as defined claim 1 wherein the phase shifting layer is positioned between a portion of said opaque layer and a non-etched transmitting portion of said substrate.

5. A photomask for printing multiple configurations as defined in claim 1 wherein the phase shifting layer is positioned between opposing portions of said opaque layer and opposing, non-etched transmitting portions of said substrate.

6. A photomask for printing multiple configurations as defined in claim 1 wherein said phase shifting layer is etched into said substrate.

7. A photomask for printing multiple configurations as defined in claim 1 wherein said phase shifting layer is added to the surface of said substrate.

8. A photomask for printing multiple configuration as defined in claim 1 wherein the wavelength of the first exposure light is about 365 nm.

9. A photomask for printing multiple configurations as defined in claim 1 wherein said second exposure light has a wave length of about 248 nm.

10. A photomask for printing multiple configurations comprising:
    a transparent, quartz substrate;
    a patterned opaque layer on a surface of substrate defining transmitting and
    non-transmitting portions; and
    a phase shifting layer having a depth of about 1.942 μm such that an exposure light having a wavelength of about 365 nm is phase shifted about 188° and a second exposure light having a wavelength of about 248 nm is phase shifted about −7°.

11. A photomask for printing multiple configurations comprising:
    a transparent substrate;
    a patterned opaque layer on a surface of said substrate defining transmitting and non-transmitting portions; and
    a phase shifting layer having a depth that shifts the phase of a first exposure light a
       predetermined amount so as to print a first configuration and shifts the phase of a second exposure light a predetermined amount to print a second configuration.

12. A photomask for painting multiple configurations as defined in claim 11 wherein said phase shifting layer has a depth of about 1.942 μm.

13. A photomask for painting multiple configurations as defined in claim 11 wherein said phase shifting layer shifts the phase of said first exposure light about 180° and shifts the phase of the second exposure light about 0°.

14. A photomask for printing multiple configurations as defined in claim 11 wherein said phase shifting layer is positioned between a portion of said opaque layer and a non-etched transmitting portion of said substrate.

15. A photomask for printing multiple configurations as defined in claim 11 wherein the phase shifting layer is positioned between opposing portions of said opaque layer and opposing, non-etched transmitting portions of said substrate.

16. A method of creating a photomask that can be used to print multiple configurations comprising:
    patterning an opaque layer on a surface of a transparent substrate to create transmitting and non-transmitting portions; and
    creating a phase shifting layer adjacent said opaque layer which shifts the phase of a first exposure light a predetermined amount so as to print a first configuration and shifts the phase of a second exposure light a predetermined amount to print a second configuration.

17. A method of creating a photomask that can be used to print multiple configurations as defined in claim 16 wherein said phase shifting layer is etched into said substrate.

18. A method of creating a photomask that can be used to print multiple configurations as defined in claim 16 wherein said phase shifting layer is added to the surface of said substrate.

* * * * *